(12) United States Patent
Miller

(10) Patent No.: US 6,622,103 B1
(45) Date of Patent: Sep. 16, 2003

(54) SYSTEM FOR CALIBRATING TIMING OF AN INTEGRATED CIRCUIT WAFER TESTER

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 281 days.

(21) Appl. No.: 09/598,399

(22) Filed: Jun. 20, 2000

(51) Int. Cl.[7] ............................................. G01R 31/26
(52) U.S. Cl. ........................................................ 702/89
(58) Field of Search ........................ 702/89, 119, 85; 324/158.1, 765

(56) References Cited

U.S. PATENT DOCUMENTS

| | | | | |
|---|---|---|---|---|
| 5,608,337 A | * | 3/1997 | Hendricks et al. | 324/765 |
| 6,040,691 A | * | 3/2000 | Hanners | 324/158.1 |
| 6,064,948 A | * | 5/2000 | West et al. | 702/119 |
| 6,163,759 A | * | 12/2000 | Kita | 702/85 |

* cited by examiner

*Primary Examiner*—Michael Nghiem
*Assistant Examiner*—Tung S Lau
(74) *Attorney, Agent, or Firm*—Smith-Hill and Bedell

(57) ABSTRACT

A timing calibration system for a wafer level integrated circuit (IC) tester is disclosed. The tester includes channels linked by paths through an interconnect system to pads of the IC. During a test each channel may send a test signal edge to an IC pad following a clock signal edge with a delay including "programmable drive" delay and "drive calibration" delay components, or may sample an IC output signal following the clock signal edge with a delay including "programmable compare" delay and adjustable "compare calibration" delay components. The interconnect system also links a spare channel to a point on the IC. To adjust the compare calibration delay of each channel, the interconnect system sequentially connects the tester channels to interconnect areas on a "calibration" wafer instead of to the IC on the wafer to be tested. Each interconnect area provides a path linking a channel to be calibrated to the spare channel. With the programmable drive delay of the channel being calibrated and the programmable compare and compare calibration delays of the spare channel set to standard values, the drive calibration delay of the channel being calibrated is adjusted so it sends a test signal edge to the spare channel close to when the spare channel samples it. Pairs of tester channels are then interconnected through another wafer interconnect area. Each channel then sends a test signal edge to the other tester channel with a standard delay following a clock signal edge to provide a reference for calibrating the receiving channel's compare calibration delay.

16 Claims, 7 Drawing Sheets

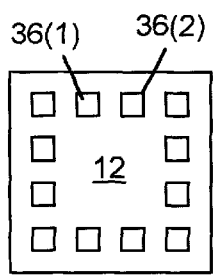
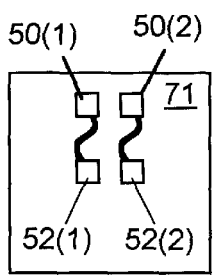
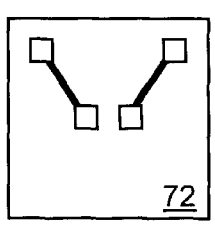
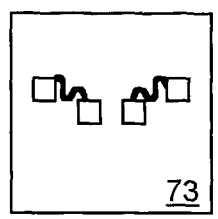
FIG. 22    FIG. 23    FIG. 24    FIG. 25
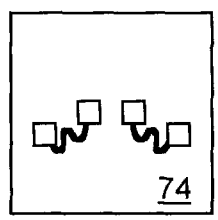
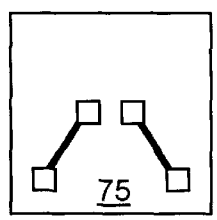
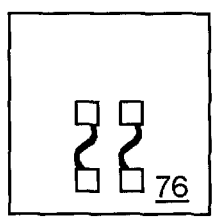
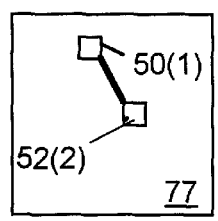
FIG. 26    FIG. 27    FIG. 28    FIG. 29
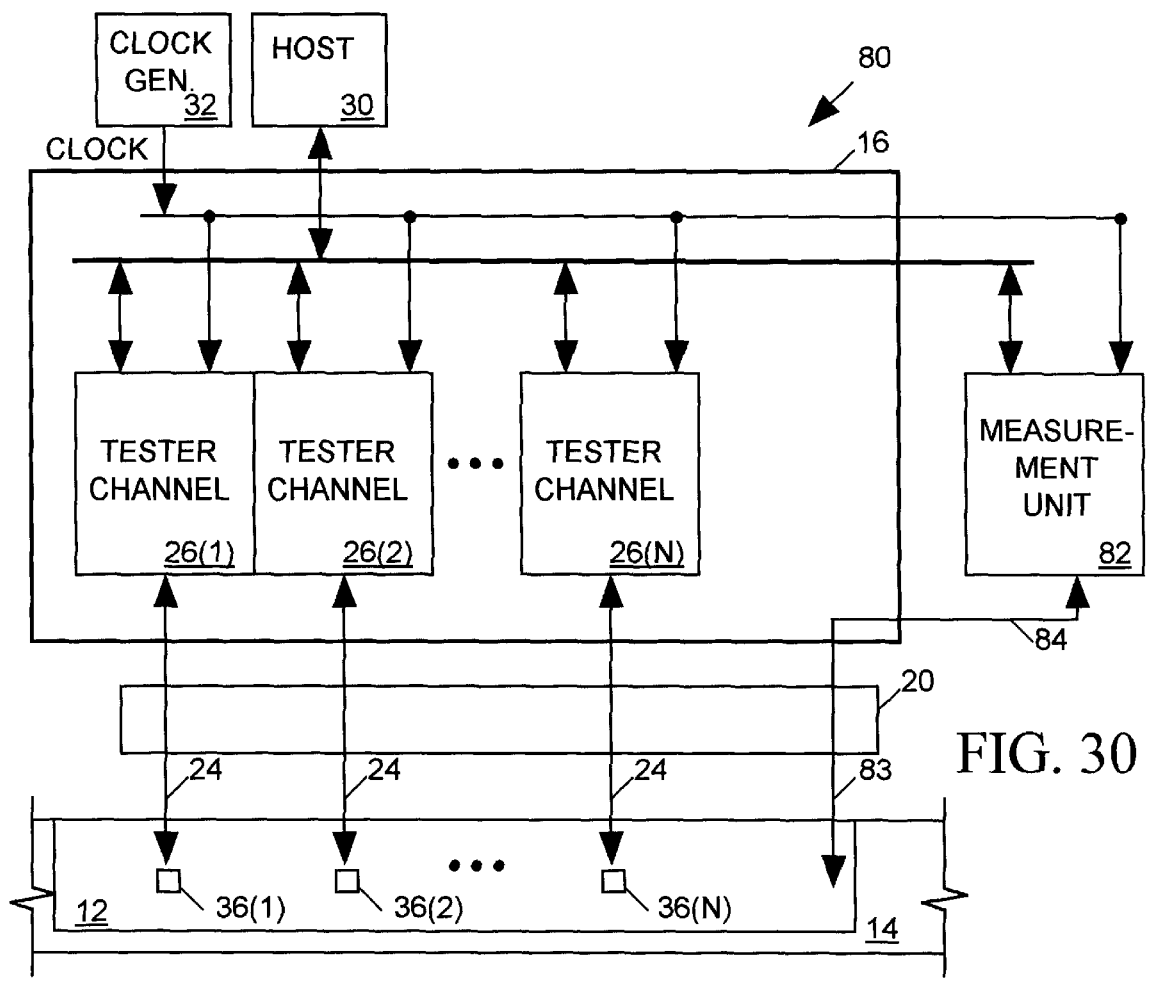
FIG. 30

SYSTEM FOR CALIBRATING TIMING OF AN INTEGRATED CIRCUIT WAFER TESTER

BACKGROUND OF THE INVENTION

1. Field of the Invention

The present invention relates in general to integrated circuit (IC) wafer testers and in particular to a system for calibrating signal timing of IC wafer tester channels to compensate for variation in signal paths between the tester and test probe points on a calibration wafer.

2. Description of Related Art

Integrated circuits (ICs) are usually fabricated in the form of die on a semiconductor wafer, and the die may thereafter be separated from one another and packaged. To avoid the cost of packaging defective ICs it is advantageous to test the ICs while they are still wafer form. An integrated circuit tester tests an IC by sending a sequence of test signals to its input terminals and monitoring the output signals produced by the IC to determine whether they behave as expected. A typical integrated circuit tester includes a "test head" containing circuit boards implementing a set of tester channels. Each tester channel is capable of supplying a test signal input to an IC input/output (I/O) terminal or of monitoring an IC output signal produced at that I/O terminal. A tester also includes an interconnect system to link each tester channel to an appropriate I/O terminal of a die on the wafer under test. For example an interconnect system may include a "probe card" having an upper surface including contact points for receiving tips of pogo pins extending downward from the test head for conveying signals between the channels in the test head and the probe card. A set of probes on an undersurface of the probe card are arranged to contact pads or other types of contact points on the surface of the IC die that act as the IC's I/O terminals. The probe card also includes vias and other conductors for interconnecting the probes and the pogo pin contacts. Since the product of the number of I/O terminals on a die and the number of die on a wafer usually exceeds the number of available channels on a tester, the tester usually tests part of the wafer per probe touchdown, sometimes only one die. A "prober" that holds the wafer while being tested positions the particular set of die to be tested under the probes and brings the wafer into contact with the probe tips during testing. After each test is completed the prober repositions (steps) the wafer so that the probes access a next set of die to be tested.

To properly test an IC, a tester must coordinate the timing of the activities of its channels. When a first tester channel changes the state of an IC input signal at some IC input terminal, we might expect a second tester channel to observe a particular state change in an IC output signal appearing at some IC output terminals a specific time thereafter. We consider an IC to be defective when an appropriate IC output signal state change does not occur with the correct delay following an IC input signal state change. Thus the tester must closely coordinate the time at which the first tester channel changes the input signal state with the time at which the second tester channel samples the IC output signal to determine its state.

An IC tester coordinates the timing of test events by supplying a periodic master clock signal concurrently to all of its channels. The channels time their activities with reference to the timing of edges of that master clock signal. However merely supplying the same master clock signal to all channels is not sufficient to ensure that they will precisely coordinate timing of events. One reason for this is that since the channels reside in separate locations within the test head, the master clock signal must travel from its source to each channel by a separate signal path, and differences in the lengths or electrical characteristics of each clock signal path can cause the clock signal edges to arrive at the channels at different times. Differences in timing can also arise from differences between channels. While tester channels may be made of integrated circuits of identical design, due to process variations no two ICs are exactly alike and one IC may process signals slightly faster than another. Also since the channels reside in separate locations within the test head, they may operate in differing temperature environments or may be subject to differing levels of stray capacitance or other environmental factors that influence the speed with which signals pass through internal circuits and conductors within each channel. Variations in the lengths or impedance characteristics of signal paths through the interconnect system linking the tester channels to the wafer also cause timing variations between the channels.

To provide more precise timing coordination, it is necessary to calibrate the timing of each channel to greatly reduce the timing variations caused by such factors. For example a tester channel typically includes a timing signal generator for producing a set of timing signals that are of varying phase relative to the master clock signal. The timing signals control the timing of various test events such as the state changes in the test signal sent to the DUT or the sampling of DUT output signals. Some testers provide a mechanism for separately retarding or advancing the phase of the timing signals of each channel relative to the master clock signal to compensate for timing differences between channels. Other testers employ other mechanisms for separately adjusting each channel's timing relative to the master clock signal.

To make use of such timing calibration systems it is necessary to separately measure the timing of each channel to determine whether to retard or advance the timing of the channel's activities relative to the master clock signal. Typically the timing of state changes in a test signal produced at each channel I/O terminal (e.g. pogo pin) is compared to the timing of state changes of the master clock signal. The relative phase of the timing signals produced by each channel can then be iteratively adjusted so that the state change in its output test signal occurs on an edge of the master clock signal. This ensures that all channels have the same relative timing with respect to events at the tips of the pogo pins.

Although the measurement of event timing at the pogo pin tips rather than at the probe tips that contact the device under test does not account for differences in the signal paths provided by the interconnect system linking the channel I/O terminals to wafer test points, the measurement is carried out at the pogo pins, rather than at the probe tips for several reasons. First, it is much easier for test equipment to access the pogo pins than the probe tips because the pogo pins are much larger and more widely spaced. Secondly, since different wafers require different interconnect systems, it would be necessary to re-calibrate the system whenever a new interconnect system is required. Finally, and perhaps most importantly, the relatively small timing skew caused by interconnect system signal path differences can often be ignored.

However as the operating frequency of ICs has continued to increase, the resolution with which events must be timed has also increased to the point where even small variations in signal paths through the interconnect system can no longer be ignored. Therefore what is needed is a system for easily measuring timing differences between channels at the tips of the probes that contact the wafer.

Another factor associated with the paths that interconnect tester channels to a wafer can adversely affect the ability of a tester to test a high frequency IC. All signal paths attenuate signals, and the amount of signal attenuation depends not just on the path resistance but also on its frequency response—a function of the path's resistance, capacitance and inductance. Signal paths generally attenuate higher frequency signals more than lower frequency signals. A signal path having a relatively low frequency response can attenuate a high frequency IC input or output signal so much that it will change its apparent state when it arrives at its destination. Thus as IC signal frequencies continue to increase, test engineers have begun to pay more attention to the frequency response of the interconnect paths to make sure they don't attenuate high frequency signals too much.

However the frequency response of an interconnect system signal path may not be what a test engineer expects it to be. Frequency response can vary, for example, due to errors in fabrication, distortion or contamination of probes or other system components, or environmental influences. When the frequency response of an interconnect path is not what it should be, states of high frequency logic signals can be misinterpreted by the tester or by the IC under test, and otherwise healthy ICs can fail tests.

Hence what is also needed is a system for easily measuring the frequency response of the signal paths of the interconnect system.

SUMMARY OF THE INVENTION

The present invention relates to an integrated circuit tester for testing an integrated circuit (IC) while still in the form of a die on a semiconductor wafer. The tester includes a set of tester channels that are linked by paths through an interconnect system to input/output terminals (pads) of the IC. Each channel includes a driver circuit for selectively sending a test signal to the pad via the interconnect path. The drive circuit can change the state of the test signal following each edge of a clock signal with a delay that includes the sum of a "programmable drive" delay and an adjustable "drive calibration" delay. Each channel also includes a compare circuit that can receive any IC output signal produced at IC pad and determine the output signal's state with a delay following each clock signal edge that includes the sum of a "programmable compare" delay and an adjustable "compare calibration" delay. The invention relates in particular to a method and apparatus for adjusting the drive and compare calibration delays of the tester channels so that their activities can be closely coordinated when the IC is being tested.

In accordance with a first aspect of the invention, the interconnect system is adapted to provide an additional path linking a spare tester channel to a point on the IC other than a pad.

In accordance with a second aspect of the invention, to calibrate the timing of each tester channel that is to access an IC pad, the interconnect system sequentially connects the tester channels and spare channel to a set of connector areas on a calibration wafer. Each interconnect area includes a pair of terminals connected by a conductive path for linking an interconnect path leading to one of the tester channels to be calibrated to an interconnect path leading to the spare tester channel. Each connector area therefore allows a separate tester channel to send a test signal to the spare tester channel or to receive a test signal from the spare tester channel.

In accordance with a third aspect of the invention, each tester channel to be calibrated is programmed to produce an edge in its output test signal following selected clock signal edges with the same programmable drive delay. Each tester channel is then linked to the spare channel via one of the interconnect arcas on the calibration wafer so that its output test signal edge is sent to the spare tester channel. The spare tester channel is programmed to repeatedly sample a test signal with a fixed delay after each of the selected CLOCK signal pulses. The drive calibration delay of each tester channel is iteratively adjusted until the spare channel samples the test signal as close as possible to its edge.

In accordance with a fourth aspect of the invention, after the drive calibration delay of each tester channel is adjusted, pairs of tester channels are linked through additional interconnect areas on the calibration wafer when accessed via the interconnect system. One tester channel of each pair then sends a test signal edge to the other tester channel of the pair with a known programmable delay. The other tester channel of the pair is programmed to sample the test signal with the same known programmable delay. The compare calibration delay of the other tester channel is then iteratively adjusted until it samples the teat signal as close as possible to the test signal edge. The roles of the two channels of each pair are then reversed and the process is repeated to adjust the compare calibration delay of the other tester channel.

The above-described system calibrates the drive and compare timing of the tester channels not with respect to events occurring at their I/O terminals, but with respect to events occurring at the tips of the probes that contact the IC pads during a test. Thus unlike prior art systems, the calibration system of the present invention calibrates timing to account for differences not just in the tester channels but also in the signal paths linking those tester channels to the ICs being tested. This permits testing of high frequency ICs where it is necessary to provide very precise control over timing of events at the IC terminals.

It is accordingly an object of the invention to provide a system for adjusting the drive and compare calibration delays of IC tester channels so that their test activates may be closely coordinated.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 22 is a simplified plan view of an IC to be tested;

FIGS. 23–29 are simplified plan views of a set of interconnect areas of a semiconductor calibration wafer in accordance with the invention for use in calibrating timing of tester channels of an IC tester that is to test the IC of FIG. 22;

FIG. 30 is a simplified block diagram of an integrated circuit tester lined to a measurement unit in accordance with the invention;

DESCRIPTION OF THE PREFERRED EMBODIMENT(S)

Figure 1:
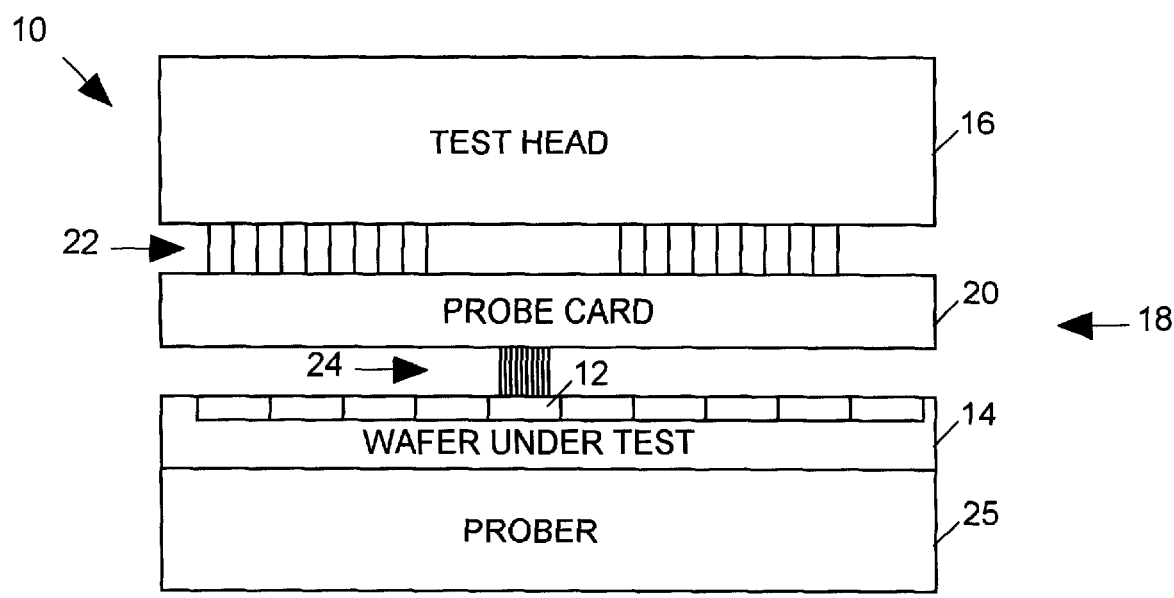
FIG. 1 is a simplified sectional elevation view of a typical prior art integrated circuit (IC) tester for testing ICs in the form of die on a semiconductor wafer.
Figure 2:
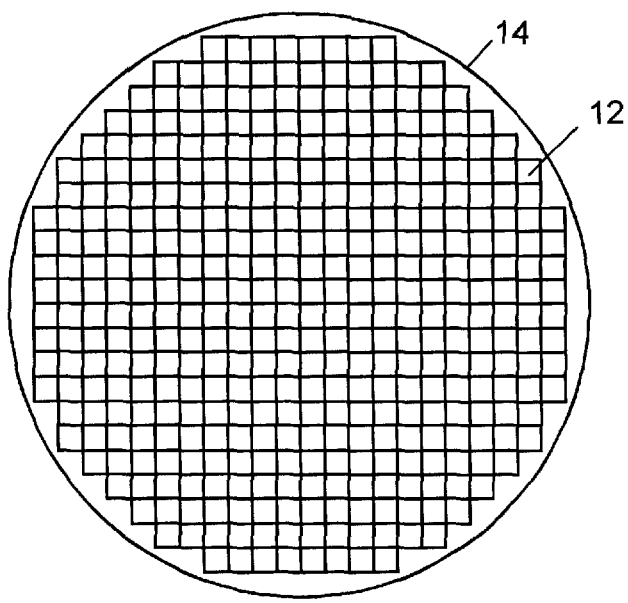
FIG. 2 is a simplified plan view of a prior art semiconductor wafer.

FIG. 1 is a simplified sectional elevation view of a typical prior art integrated circuit (IC) tester 10 for testing an IC device 12 implemented as one of many die on a semiconductor wafer 14. FIG. 2 is a simplified plan view of wafer 14 implementing a large number of ICs 12. Tester 10 includes a chassis called a "test head" 16 containing circuit boards implementing a set of tester channels. Each tester channel is capable of supplying a test signal input to an input/output (I/O) terminal of IC 12 and/or of monitoring an IC output signal produced at that I/O terminal to determine its state. Tester 10 also includes an interconnect system 18 for linking each tester channel within test head 16 to an appropriate I/O terminal on the surface of an IC 12 being tested. In this example, interconnect system 18 includes a probe card 20 having an upper surface including contact points for receiving tips of pogo pins 22 (or other interconnect structures such as coaxial cables) extending downward from test head 16 for conveying signals between the channels within the test head and probe card 20. A set of probes 24 (such as, for example, microspring contacts) on the lower side of probe card 20 are arranged to access pads on the surface of IC 12 that act as the IC's I/O, power and ground terminals. Conductors (not shown) within probe card 20 link each pogo pin 22 to one or more probes 24 to complete the signal paths between the tester channels and I/O terminals of IC 12. In some cases various passive components such as resistors and capacitors may be mounted on probe card 20 to influence the frequency response of those signal paths.

Since wafer 14 implements a large number of ICs 12, and since each IC can have many I/O terminals, tester 10 does not have enough channels to test all ICs 12 on wafer 14 at the same time. Since tester 10 may tests only one IC 12 or just a few ICs 12 concurrently, a "prober" 25 holding wafer 14 positions the particular IC (or ICs) 12 to be tested under probes 24 and brings them into contact with the probes. After each test is completed prober 25 repositions ("steps") wafer 14 so that the probes access the next IC (or ICs) to be tested.

Figure 3:
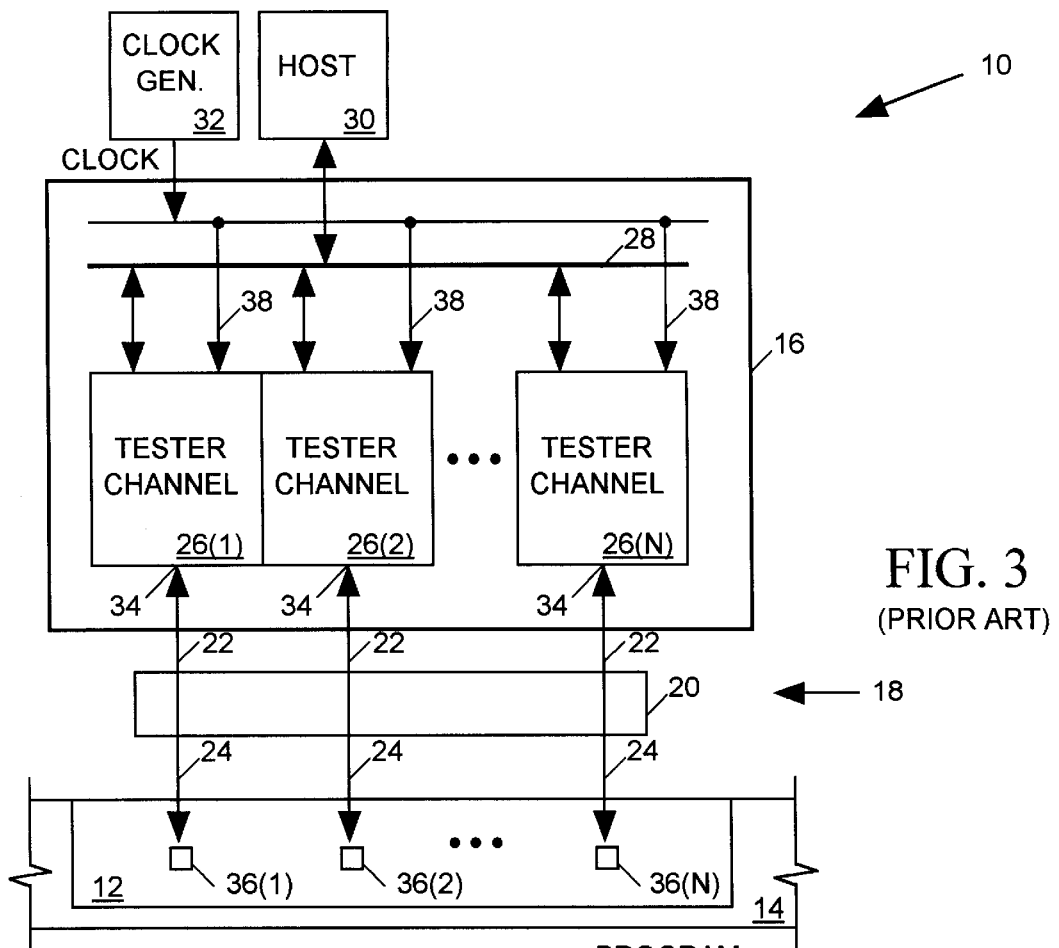
FIG. 3 is a block diagram illustrating the tester of FIG. 1.

FIG. 3 is a block diagram illustrating tester 10 of FIG. 1. Test head 16 includes a set of tester channels 26 interconnected via a bus 28 to a host computer 30. Before a test, host computer 30 programs each channel 26 to carry out a sequence of test activities in response to edges of a periodic CLOCK signal produced by a clock generator 32 and distributed to all tester channels 26. Interconnect system 18 links channel I/O terminals 34 of tester channel 26 to test points 36 on IC 12.

Figure 4:
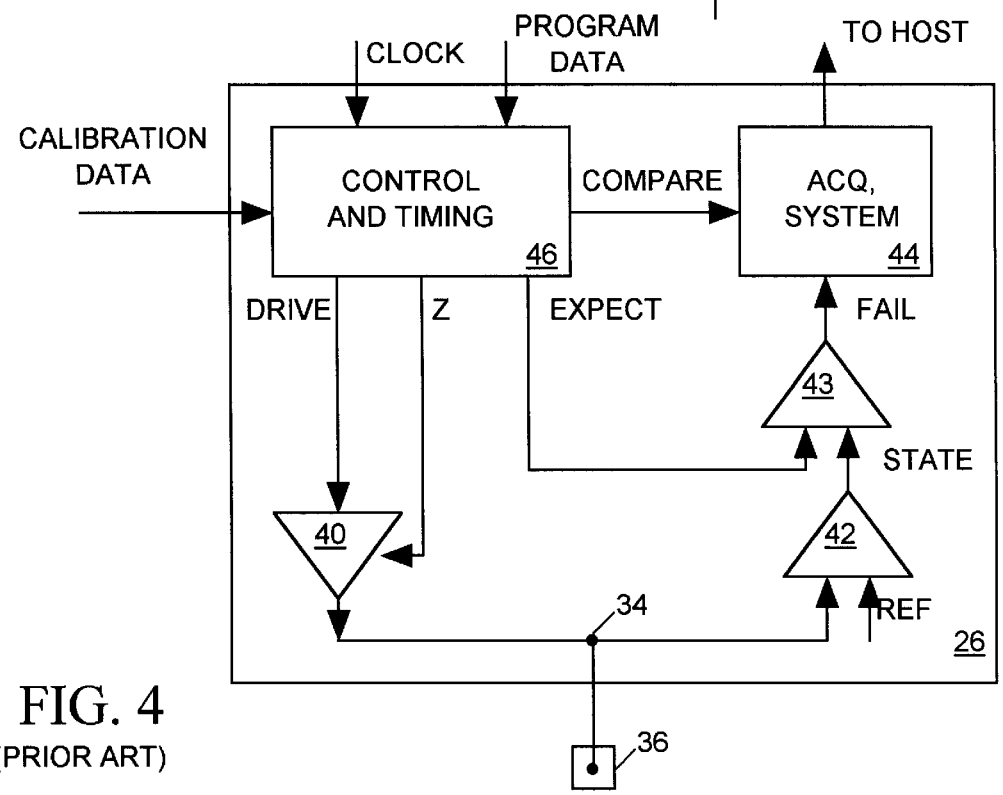
FIG. 4 illustrates one of the tester channels of the tester of FIG. 3 in simplified block diagram form.

FIG. 4 illustrates one of tester channels 26 of FIG. 3 in simplified block diagram form. Tester channel 26 includes a tristate buffer 40 for transmitting a test signal to an IC terminal 36. An analog comparator circuit 42 compares an IC output signal produced at IC terminal 36 to a reference voltage (REF) and produces a digital output signal STATE indicating the state of the IC output signal. A digital comparator 43 compares the actual state of the IC output signal (STATE) to data representing its expected state (EXPECT) to produce a FAIL signal indicating whether the IC output signal is of its expected state. A data acquisition system 44 delivers the FAIL data for each test cycle to host computer 30.

Each edge of the CLOCK signal marks the start of a test cycle in which channel 26 is to carry out one or more activities defined by programming data supplied by host computer 30 of FIG. 3 before the start of a test. A control and timing circuit 46 may respond to each edge of the CLOCK signal by enabling or tristating buffer 40 via a signal Z, by driving the buffer's input signal (DRIVE) high or low, and/or by supplying EXPECT data to comparator 43 and signaling acquisition system 44 via a COMPARE signal to acquire the FAIL data.

Host computer 30 supplies calibration data to each channel 26 via bus 28 (FIG. 3) to calibrate the timing of the DRIVE, Z and COMPARE signals produced by control and timing circuit 46. Suppose, for example, during a test channel 24(1) is to change the state of a test signal sent to test point 36(1) and tester channel 26(2) is expected to observe a particular state change in an IC output signal appearing at test point 36(2) N nanoseconds later. We would consider IC 12 to be defective if the output signal state change does not occur at test point 36(2) with the correct delay following the input signal state change. Thus tester 10 must be able to closely coordinate the time at which any tester channel 26 changes the state of a test signal, and the time at which any other tester channel 26 subsequently samples an IC output signal.

Since all channels 26 time their activities in relation to edges of the same CLOCK signal, those activities can be closely synchronized. However differences in the lengths or electrical characteristics of the paths 38 (FIG. 1) conveying the CLOCK signal to each channel 26 can cause CLOCK signal edges to arrive at the channels at slightly different times, thereby adversely affecting coordination of test events. Timing differences can also arise from channel-to-channel variations in inherent delays of the various channel components 40–46 (FIG. 4) or from variations in the lengths or impedance characteristics of signal paths through the interconnect system 18 linking the tester channels 26 to IC pads 36.

Host computer 30 therefore supplies calibration data to the control and timing circuit 46 of each tester channel 26 (FIG. 4) for adjusting the timing of test events carried out by the channel relative to the CLOCK signal to account for such variations so that all channels can closely coordinate test signal state changes and output signal sampling.

Referring to FIG. 4, the total drive delay $D_{DT}$ between a CLOCK signal edge and appearance of a test signal edge at IC terminal 36 is equal to the sum of the following delays:

$D_{DI}$: An inherent drive delay of the control and timing circuit, $D_{DC}$: A drive calibration delay controlled by the calibration data, $D_{PD}$: A programmable drive delay set for each test cycle by program data from the host computer, $D_D$: An inherent delay of the tristate driver, and $D_{CP}$: An inherent path delay between the tester channel and the IC terminal.

Thus $D_{DT}=D_{DI}+D_{DC}+D_{PD}+D_D+D_{CP}$

Host computer 30 uses calibration data supplied to control and timing circuit 46 to adjust $D_{DC}$ for all tester channels so that, for example, when the programmable delay $D_{PD}$ is 0, the total delay $D_T$ is a constant K for all channels Hence, $K=D_{DI}+D_{DC}+D_D+D_{DP}$ Therefore during a test, when the program data input to control and timing circuit 46 tells it to send a test signal edge to IC terminal 36 with a programmable delay $D_{PD}$ of T following a CLOCK signal edge, the test signal edge will actually arrive at terminal 36 with a delay of T+K after the CLOCK signal edge. The additional constant delay of K is not a problem because all channels provide the same additional constant drive delay.

The actual delay between a CLOCK signal edge and a COMPARE signal edge is $D_{CT}=D_{CI}+D_{CC}+D_{PC}+D_C+D_{CP}$ where $D_{CI}$ is an inherent compare delay of the control and timing circuit, $D_{CC}$ is a drive calibration delay controlled by the calibration data input to control and timing circuit 46, $D_{PD}$ is a programmable compare delay set for each test cycle by program data from the host computer, $D_C$ is an inherent delay of the tristate driver, and $D_{CP}$ is the inherent compare path delay between the tester channel and IC terminal.

When the program data tells control and timing circuit 46 that the IC output signal is to be sampled with a delay T following a CLOCK signal edge, control and timing circuit 46 should actually assert the COMPARE signal, not with a delay of T following the CLOCK signal, but at the precise moment at which the FAIL data represents the state of an IC output signal as it appeared at IC terminal 36 T+K seconds after the CLOCK signal, the calibrated drive delay. This ensures that a drive delay of T and a compare delay of T have the same meaning with respect to events at IC terminals 36.

Host computer 30 must adjust the compare calibration delay $D_{CC}$ for each channel so that when programmable compare delay $D_{PCP}$ is some value T timing circuit 46 asserts the COMPARE signal with delay $D_{CT}=T+K+D_{CP}$.

Prior Art Timing Calibration

Prior art timing calibration systems typically set all tester channels 26 for the same programmable drive delay following CLOCK signal edges and then employ an oscilloscope or other interval measurement device such as a wave crest box to measure the timing skew between test signals from channels 26 appearing at the tips of the pogo pins 22 (FIG. 1). Such systems iteratively adjust the calibration data input to control and timing circuit 46 (FIG. 4) so that there minimal measurable timing skew difference between test signal outputs of the various channels at the pogo pin tips when the channels are programmed for the same nominal delay. The Z signal delay is calibrated in a similar manner.

The COMPARE signal timing for each channel 26 is typically calibrated after the DRIVE signal timing is calibrated. One way to do that is to program a channel to set a DRIVE signal edge to an open or short circuited probe tip at some known time after each CLOCK signal pulse. The edge is then reflected back to compare circuit 42. The REF voltage and EXPECT data set to cause the FAIL signal to change state in response to each reflected DRIVE signal edge. The calibration data input to control and timing circuit 46 of each channel 26 is then iteratively adjusted until acquisition system 44 samples the FAIL signal just as it changes state.

The calibration process is carried out at the tips of pogo pins 22 (FIG. 1) rather than at the tips of the probes 24 that contact IC test points 36 because pogo pins 22 are larger and more widely spaced than probes 24 and are therefore much easier for test equipment to access. Although variations in the signal paths through probe card 20 and probes 24 can increase timing differences between channels 26, such variations have been negligibly small in the past. However as IC input and output signal frequencies increase, small variations between the signal paths through interconnect system 18 become significant and must be accounted for when calibrating the timing of tester channels 16. It is therefore desirable when calibrating the timing of channels 26 to measure output signal skew at the tips of probes 24 rather than at the tips of the more easily accessible pogo pins 22. The present invention allows us to do that.

Drive Calibration

The present invention provides a method for calibrating the drive and compare timing of channels 26 of tester 10 (FIG. 3) at the tips of probes 24 so as to account for time delays through interconnect system 18. The method makes use of a set of "interconnect areas" suitably of size and shape similar to that of an IC 12. Each interconnect area is suitably implemented on separate "calibration" wafer that may be similar in size and shape to the wafer 14 to be tested. During the calibration process the calibration wafer is placed on prober 25 (FIG. 1) in lieu of the wafer 14 to be tested. The interconnect areas may also be implemented on the wafer 14 to be tested.

Figure 5:
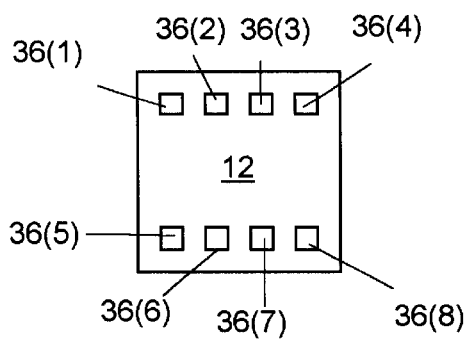
FIG. 5 is a simplified plan view of an IC of the semiconductor wafer of FIG. 4.
Figure 6:
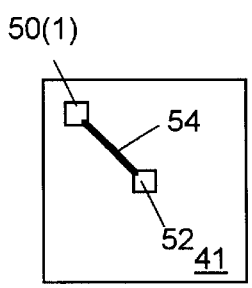
FIGS. 6–13 are simplified plan views of a set of interconnect areas of a semiconductor calibration wafer in accordance with the invention for use in calibrating timing of tester channels of an IC tester that is to test the IC of FIG. 5.
Figure 7:
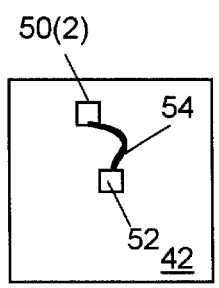
Figure 8:
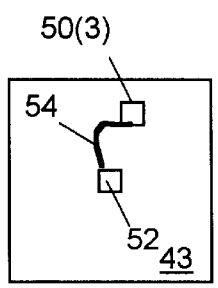
Figure 9:
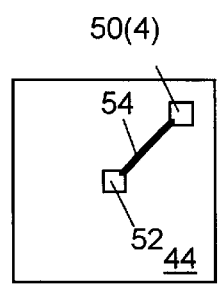
Figure 10:
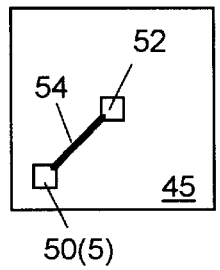
Figure 11:
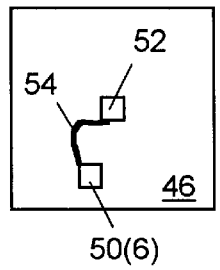
Figure 12:
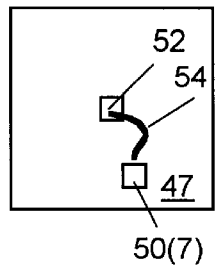
Figure 13:
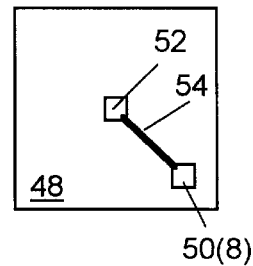

FIG. 5 is a simplified plan view of an IC 12 of a wafer 14 to be tested. In this example IC 12 includes a set of eight pads 36(1)–36(8) on its surface that are to be accessed by probes 24 of FIG. 4.

FIGS. 6–13 illustrate a set of eight interconnect areas 41–48 that may be implemented on a calibration wafer for use when calibrating timing of the eight tester channels 26 needed test IC 12 of FIG. 5. Each test area 41–48 occupies an area of the calibration wafer having the same size and shape as an area occupied by IC 12 of FIG. 5 and implements a pair of pads 50 and 52 positioned so that prober 25 (FIG. 1) may place them into contact with tips of a pair of probes 24. In particular each test area 41–48 includes a first pad 50(1)–50(8) having the same relative position as a corresponding one of pads 36(1)–36(8) of IC 12 of FIG. 5 and a second pad 52 positioned within the test area at a location that does not correspond to the position of any pad 36 in IC 12. Tester 10 of FIG. 1 is provided with an extra probe 24 for contacting pad 52 and signal path through interconnect 18 to connect that probe to a spare channel 26. When IC 12 is in place under probes 24 during a test, the extra probe 24 does not contact any pad 36. Each test area 41–48 also includes a conductor 54 interconnecting its two pads. Conductors 54 of all test areas 41–48 are suitably of a uniform length despite any differences in distance between the pads.

Figure 14:
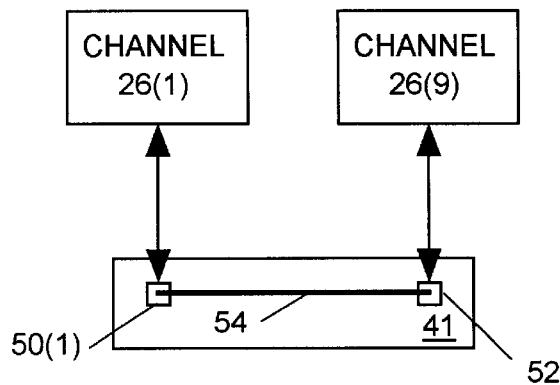
FIG. 14 is a block diagram illustrating a interconnect area in accordance with the invention for interconnecting two tester channels.

Referring to FIG. 14, to calibrate the DRIVE signal timing of channel 26(1), prober 25 (FIG. 1) initially places interconnect area 41 under probes 24. The probe 24(1) that would link channel 26(1) to contact pad 36(1) of IC 12 (FIG. 5) during a test now links channel 26(1) to pad 50(1). The extra probe 24(9) links a spare tester channel 26(9) to pad 52. Thus when tester channel 26(1) generates an output test signal, that signal travels to pad 50(1) through conductor 54 to pad 52, and then back to channel 26(9).

Host computer 30 (FIG. 3) programs channel 26(1), for example, to drive the DRIVE signal from low to high with a selected programmable drive delay ($D_{PD}$=X nanoseconds) following selected CLOCK signal pulses and programs spare channel 26(9) to sample the returning DRIVE signal with a constant programmable compare delay ($D_{CD}$=Y nanoseconds) following the CLOCK signal pulses. The REF signal and EXPECT data output of control and timing circuit 46 (FIG. 4) for channel 26(9) are set so that the FAIL data output of comparator 43 will change state in response to the DRIVE signal edge.

Figure 15:
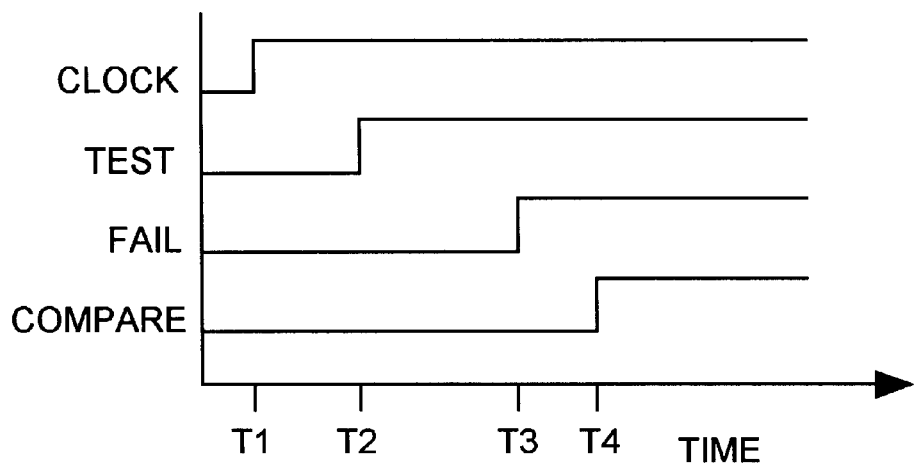
FIGS. 15–17 illustrate timing relationships between various signals within the tester channels of FIG. 14 during a timing calibration process in accordance with the invention.
Figure 16:
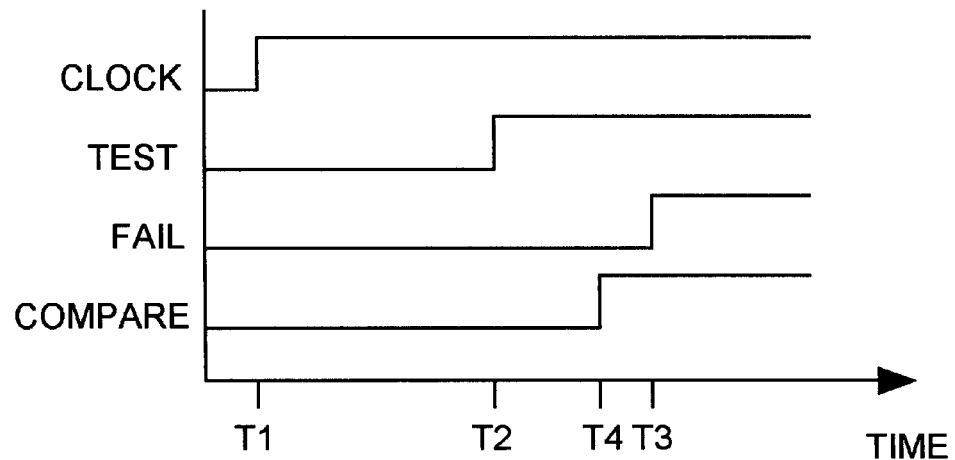
Figure 17:
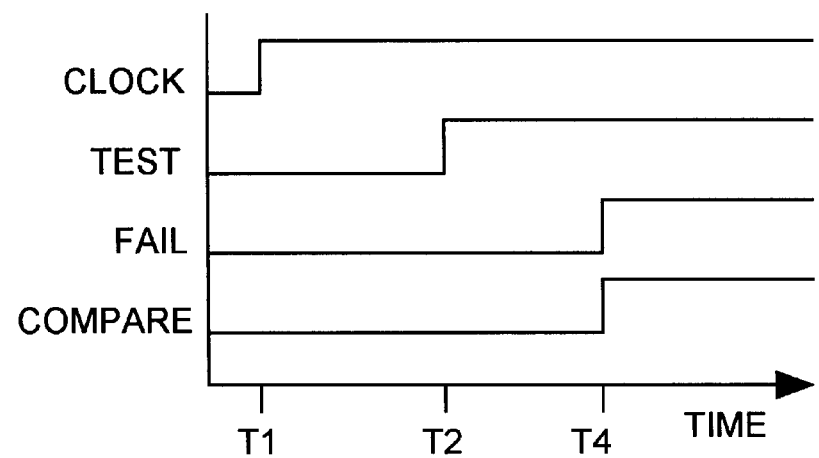

FIGS. 15–17 are timing diagrams illustrating various relationships between the CLOCK signal edge as it arrives at channel 26(9) of FIG. 14, the TEST signal edge as it arrives at pad 50(1), the FAIL signal edge as it arrives at the acquisition system 44 within channel 26(9), and the COMPARE signal edge as it initiates sampling of the FAIL signal. During the calibration process, the interval between each CLOCK signal edge at T1 and the COMPARE signal edge at time T4 remains fixed because host computer 30 does not change the COMPARE signal timing. The interval between the TEST and FAIL signals edges also remains fixed because it is a non-adjustable function of the inherent signal path delays between pad 50(1) and channel 26(9). However during the calibration process host computer 30 iteratively adjusts the interval between the CLOCK signal edge at time T1 and the TEST signal edge at time T2 by iteratively adjusting the drive calibration delay $D_{DC}$ of channel 26(1). When the COMPARE edge at time T4 occurs after the FAIL edge at time T3 as illustrated in FIG. 15, host computer 30 increments the drive calibration delay $D_{DC}$ of tester channel 26(1) to increase the DRIVE signal delay so that both the TEST and FAIL signal edges occur later relative to the COMPARE edge. Conversely, when the COMPARE edge at time T4 occurs before the PAIL edge at time T3 as illustrated in FIG. 16, host computer 30 decrements the drive calibration delay $D_{DC}$ of tester channel 26(1) delay so that both the TEST and FAIL signal edges occur earlier relative to the COMPARE signal edge. Host computer 30 iteratively repeats the process until the FAIL edge occurs as closely as possible to time T4 when the COMPARE signal changes state as illustrated in FIG. 17.

Prober 25 (FIG. 1) then places interconnect area 42 (FIG. 7) under probes 24 to link channel 26(2) to the spare channel 26(9) and repeats the above-described drive calibration process to adjust the drive calibration delay $D_{DC}$ of channel 26(2) in the same way it adjusted the drive calibration delay of channel 26(1). In doing so host computer 30 sets channel 26(2) to the same programmable drive and compare delays T to which it set channel 26(1). Thus the CLOCK-to-COMPARE edge interval (the interval between T1 and T4) during the channel 26(2) calibration will be the same as it was for the channel 26(1) calibration process. Therefore at the end of the calibration process for channel 26(2) it will have the same total TEST signal delay T2–T1 whenever they have a similar programmable DRIVE delay $D_{PD}$.

When drive calibration delays $D_{DC}$ of the remaining six tester channels 26(3)–26(8) are adjusted in a similar manner using interconnect areas 43–48 of FIGS. 8–13, respectively, all channels 26(1)–26(8) will provide substantially the same delay between a CLOCK signal edge and arrival of the TEST signal at a pad 36 on an IC 12 when they have the same programmable drive delay $D_{PD}$.

Compare Calibration

Figure 18:
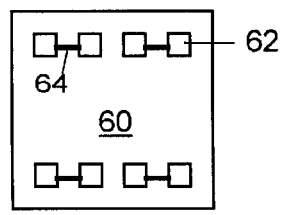
FIG. 18 is a simplified plan view of another interconnect area of a semiconductor calibration wafer in accordance with the invention for use in calibrating timing of the tester channels of the IC tester of FIG. 3.

Having calibrated the drive paths for all channels 26, host computer 30 may now calibrate the compare signal paths. To aid in compare calibration we can provide an additional interconnect area 60 as illustrated FIG. 18. Reference area 60 has a set of pads 62 similar in arrangement to pads 36 of IC 12. A set of conductors 64, suitably of length similar to conductors 54 of FIGS. 6–13, interconnect pairs of pads 62. Thus with pads 62 of interconnect area 60 being contacted by probes 24, each channel 26 can send a test signal to another channel 26 via the interconnect pads 62.

Figure 19:
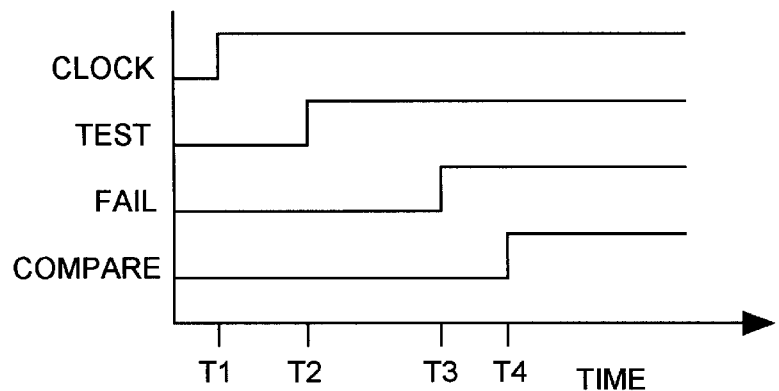
FIGS. 19–21 illustrate timing relationships between various signals within the tester channel of FIG. 3 during a timing calibration process in accordance with the invention.
Figure 20:
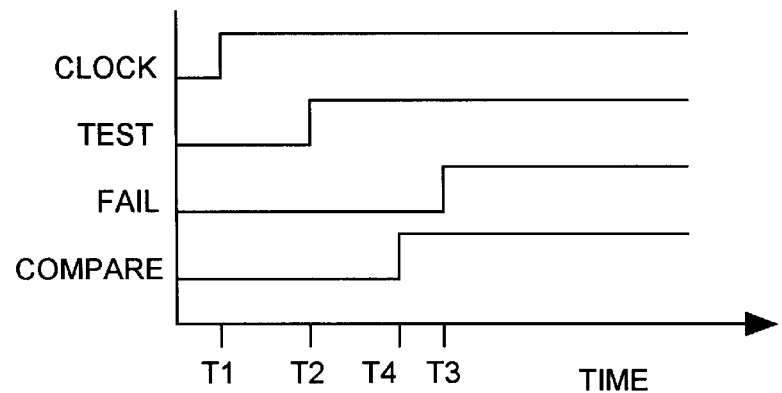
Figure 21:
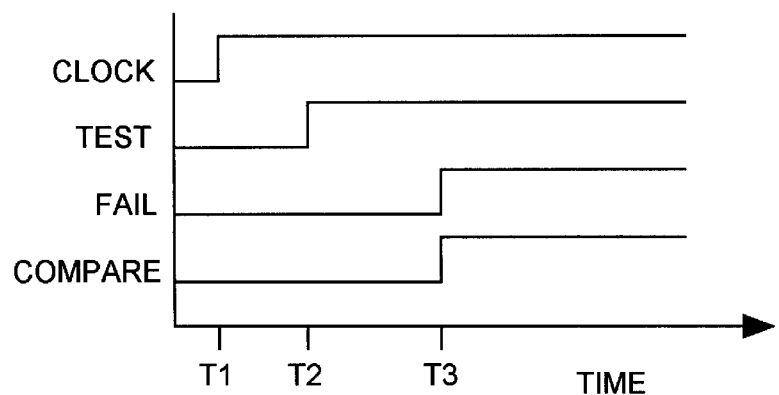

FIGS. 19–21 illustrate timing relationships between the CLOCK, TEST, FAIL and COMPARE signals of various tester channels during the compare calibration process. With interconnect area 60 in place under the testers probes, host computer 30 programs one channel 26 of each interconnected pair for the same programmable drive delay of T so that it responds to each CLOCK signal edge arriving at a time T1 by sending a test signal edge to a pad 62 at a time T2. This causes the FAIL signal to change state at a time T3 following the CLOCK signal edge. The delays T2–T1 and T3–T1 are fixed and do not change during the compare calibration process. Host computer 30 also programs the other channel 26 of each interconnected pair so that it has a programmable COMPARE signal delay $D_{CD}$ of T. As discussed above the total delay T4–T1 for the COMPARE signal will be the sum of $D_{DC}$, and the inherent and calibration delays of control and timing circuit 46. Whenever the sampled FAIL data produced by a receiving channel 26 indicates that the COMPARE signal edge at time T4 follows the FAIL edge at time T3, as illustrated in FIG. 19, host computer 30 decrements the compare calibration delay $D_{CC}$ of the receiving channel 26 to advance the COMPARE signal edge. Conversely, whenever the sampled FAIL data produced by a receiving channel 26 indicates that the COMPARE signal edge at time T4 precedes the FAIL edge at time T3, as illustrated in FIG. 20, host computer 30 increments the compare calibration delay $D_{CC}$ of the receiving channel 26 to retard the COMPARE signal edge. The compare calibration process for the receiving channel 26 ends when the COMPARE signal edge as nearly as possible coincides with the FAIL signal edge at time T3. The compare calibration process is then repeated with roles of transmitting and receiving channels 26 reversed so as to compare calibrate the remaining channels 26.

The interconnect area patterns of FIGS. 6–13 are designed for a calibration process in which the compare function of only a single spare channel 26(9) is used to calibrate the drive signal timing of all other channels 26(1)–26(8). However using a signal spare channel as a compare reference requires us to provide one interconnect area 41–48 for each channel 26(1)–26(8) to be calibrated, and also requires all channels 26(1)–26(8) to be calibrated in sequence. When an IC 12 has several hundred pads 36 instead of just 8, the drive calibration process can take a long time and require a large number of interconnect areas. We can reduce the time and number of interconnect areas required by a factor of approximately N if we employ N spare channels as compare references instead of 1.

FIG. 22 illustrates an IC having 12 pads 36 that may be tested by channels 26(1)–26(12) of the tester of FIG. 3. This arrangement would require 12 test areas for drive calibration if only one spare channel were used as a compare reference. However when two spare channels 26(13) and 26(14) are available as compare references, only seven interconnect areas would be needed. FIGS. 23–28 illustrate six of the required seven interconnect areas 71–76. Reference area 71 includes a first pair of pads 52(1) and 52(2) accessed by the two spare channels 26(13) and 26(14). A second pair of pads 50(1) and 50(2) in area 71 are accessed by channels 26(1) and 26(2) that also access a pair of pads 36(1) and 36(2) of IC 12 of FIG. 22. Reference areas 72–76 are generally similar to interconnect area 23 except that the second pair of pads in each area 72–76 are positioned to correspond to different pairs of pads 36 of IC 12.

The drive calibration process for each tester channel is generally similar to that described above except that two channels can be drive calibrated concurrently. However before drive calibrating the channels it is necessary to first adjust the compare calibration of one of the two spare channels 12(13) and 12(14) so that they will have matching compare timing when the tester channels are drive calibrated. Test area 71 of FIG. 23 is initially placed under the probes. The first spare channel 26(13) accessing pad 50(1) is then compare calibrated using channel 26(1) (FIG. 3) accessing pad 50(1) as a drive reference. An additional interconnect area 77 (FIG. 29) is then placed under the probes. Note that whereas interconnect area 71 of FIG. 23 links channel 26(1) to the first spare channel via pads 50(1) and 52(1), interconnect area 77 links channel 26(1) to a second spare channel via pads 50(1) and 52(2). With interconnect area 77 in place and again using channel 26(1) as a drive references, the second spare channel 26(14) is compare calibrated to match the compare calibration of the first spare channel 26(13). Thereafter the interconnect areas 71–76 are successively placed under the probes and the two spare channels 26(13) and 26(14) are used as compare references to compare calibrate the twelve channels.

By extension, it should be apparent from the foregoing discussion that for ICs having large numbers of pads, more than two spare channels can be used as compare references to further reduce the number of interconnect areas and the time needed to drive calibrate the tester channels.

Figure 31:
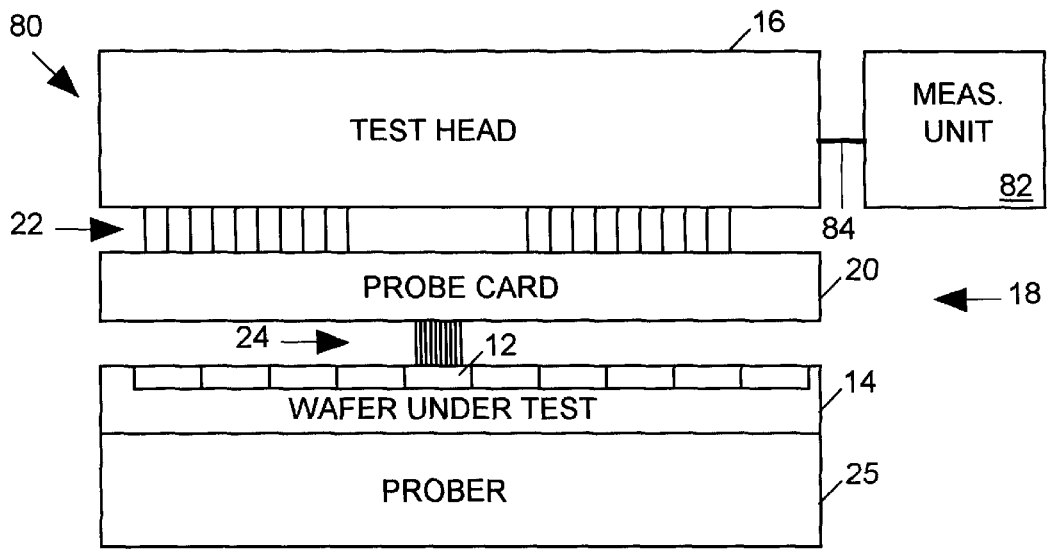
FIG. 31 is a simplified sectional elevation view of the integrated circuit tester and measurement unit of FIG. 30.

FIG. 30 illustrates an integrated circuit tester 30 that is generally similar to prior art tester 10 of FIG. 3 except that it includes connections for extending the CLOCK signal and bus 28 to an external "measurement unit" 82. FIG. 31 is a simplified sectional elevation view of the integrated circuit tester and measurement unit of FIG. 30, including a probe card 20 providing contact to a wafer 14 on a prober 25.

Referring to FIG. 30, an additional path through probe card 20 and a conductor 84 in test head 16 link an additional probe 83 measurement unit 82. Measurement unit 82 does not take part in IC tests, so while the probe 83 accessed by measurement unit 82 contacts IC 12 when the IC is under test, the probe does not contact any of the IC's pads 36.

Measurement unit 82 includes a conventional interval measurement circuit for measuring an interval between an edge of the CLOCK signal produced by clock generator 32 and an edge of a signal arriving via probe 83 and reporting the time interval back to host computer 30. Assuming the IC 12 to be tested has the pad arrangement shown in FIG. 5, the interconnect areas illustrated in FIGS. 6–13 are successively positioned to connect interval measurement unit 82 to each tester channel 26(1)–26(8). Host computer 30 can therefore use measurement unit 82 to measure the absolute time interval between the CLOCK signal edge and the arrival of test signal edge from each tester channel 26(1)–26(8). With all channels 26(1)–26(8) set for the same programmable delay, host computer 30 can calibrate the drive delays of all channels by iterative adjusting the drive calibration delay of each channel until measurement unit 82 measures the same delay for all channels.

More than one measurement unit 82 could be provided so as to reduce the number of interconnect areas and to reduce the time needed to drive calibrate the tester channels. For example when two measurement units 82 are provided, the interconnect area patterns of FIGS. 23–28 could be used to drive calibrate the channels accessing the pads of IC 12 of FIG. 22. The additional pattern of FIG. 29 could be used, if necessary, to allow host computer 30 determine any differences in the interval measurements of the two measurement units so that it may compensate for such differences which drive calibrating the channel.

Fly-by Compare Calibration

Referring to FIG. 3, the driver 40 and comparator 42 of prior art tester channel 26 are linked to IC pad 36 via a single interconnect path. Thus when pad 36 can both transmit IC output signal and receive IC input signal, the input and output signals must travel over the same path. In high frequency applications, the interconnect system path delay adversely affects the channel's ability to determine the state of an IC output signal pulse that closely follows or precede an IC input signal pulses since parts of the two pulses can overlap at the input of comparator 42.

Figure 32:
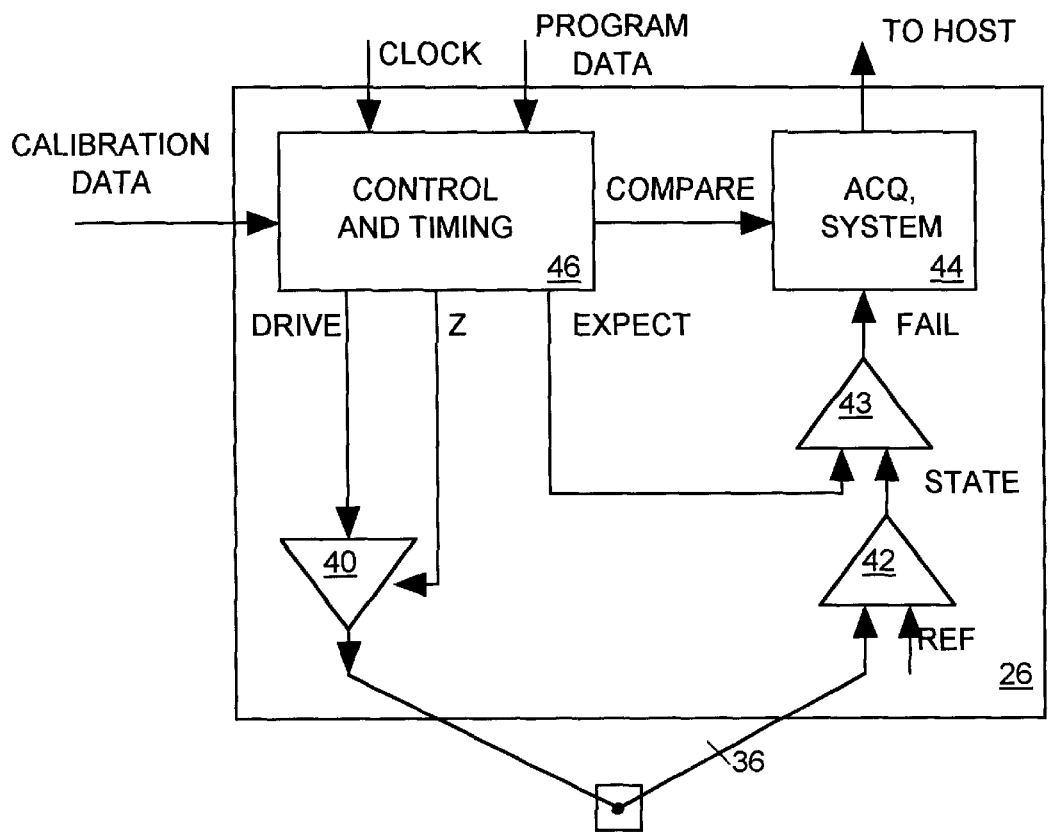
FIG. 32 illustrates a in block diagram form a prior art tester channel connected to an IC pad via a conventional fly-by interconnect system.

FIG. 32 illustrates an alternate "fly-by" system for connecting channel 26 to pad 36 via two paths, one from driver 40 to pad 36 and the other from pad 36 to comparator 42. When the signal path from driver 40 is properly terminated at pad 36, IC input signals do not appear at the input to driver 42. Thus even closely space input and output signals are not overlapped at the input to comparator 42.

The tester channel 26 of FIGS. 3 and 32 can be drive and compare calibrated in the manner described above regardless of whether one or two paths are used to connect the channel to pad 36. However with the fly-by connection shown in FIG. 32, the compare calibration also can be carried out in a slightly different manner that does not require the use of a interconnect area. As described above, for compare calibration of a interconnect area is used to link a pair of tester channels. The drive circuit of one of the tester channels produces a test signal edge that is used as a reference when adjusting the compare calibration delay of the other channel. With the fly-by connection illustrated in FIG. 32, the driver 40 within each channel's can supply a test signal timing edge as a timing reference when the channel's compare calibration delay is being adjusted. Thus in such case it isn't necessary to use connectors areas to link pairs of channels during the compare calibration process.

While the forgoing specification has described preferred embodiments of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method for calibrating timing of an integrated circuit (IC) tester and an interconnect system for connecting the IC tester to input/output (I/O) terminals of an IC implemented on a semiconductor wafer, wherein the IC tester includes a plurality of tester channels for testing the IC implemented on the semiconductor wafer, wherein the tester also includes a spare channel, wherein the tester includes means for sending a sequence of clock signal edges to the tester channels and to the spare channel, wherein the tester channels and the spare channel each include means for generating an output signal having an edge following receipt of any of said clock signal edges with a drive delay including a programmable drive delay and an adjustable drive calibration delay and for sampling an input signal following any of said clock signal edges with a compare delay including a programmable compare delay and an adjustable compare calibration delay, and wherein the interconnect system contacts said IC to provide a first conductive path between each said I/O terminal and a corresponding one of said tester channels for conveying signals therebetween, the method comprising the steps of:
a. adapting said interconnect system to provide a second conductive path;
b. providing a plurality of first conductors, each corresponding to a separate one of said tester channels; and
c. for each tester channel of said plurality of tester channels:
   c1. causing said interconnect system to contact the tester channel's corresponding first conductor, wherein the corresponding first conductor and the first and second conductive paths form a first signal path between said tester channel and said spare channel,
   c2. causing said tester channel to repeatedly send its output signal as an input signal to said spare channel via said first signal path, and
   c3. concurrent with substep c2, causing said spare channel to sample its input signal with a fixed delay following said clock signal edges.

2. The method in accordance with claim 1 wherein step c further comprises the substeps of:
c4. concurrent with substeps c2 and c3, adjusting the calibration delay of the tester channel such that the tester channel sends said output signal to said spare channel with its output signal's edge delayed from one of said clock signal edges such that the spare channel samples the output signal near said output signal edge.

3. The method in accordance with claim 2 further comprising the steps of:
d. providing a plurality of second conductors; and
e. following step c, causing said interconnect system to contact said second conductors, wherein the interconnect system and said second conductors provide second signal paths between pairs of the tester channels.

4. The method in accordance with claim 3 further comprising the steps of:
f. following step e, for each of said pairs:
   f1. causing one tester channel of said pair to send an output signal having an output signal edge via said signal path to another tester channel of the pair, and
   f2. concurrent with substep f1, adjusting the calibration delay of said another tester channel of the pair so that it samples the output signal near said output signal edge.

5. The method in accordance with claim 3 wherein said plurality of first conductors and said plurality of second conductors are implemented on said semiconductor wafer.

6. The method in accordance with claim 3 wherein said plurality of first conductors and said plurality of second conductors are implemented on a calibration wafer other than said semiconductor wafer.

7. The method in accordance with claim 1 wherein said plurality of said first conductors are implemented on said semiconductor wafer.

8. The method in accordance with claim 1 wherein said plurality of first conductors are implemented on a calibration wafer other than said semiconductor wafer.

9. A method for calibrating timing of an integrated circuit (IC) tester and an interconnect system, wherein the IC tester has a plurality of tester channels for testing an IC implemented on a semiconductor wafer, wherein the wafer has a plurality of input/output (I/O) terminals, each I/O terminal corresponding to a separate one of said tester channels, wherein the tester includes means for sending a sequence of clock signal edges to the tester channels and to the spare channel, wherein the tester channels and the spare channel each include means for generating an output signal having an edge following receipt of any of said clock signal edges with a drive delay including a programmable drive delay and an adjustable drive calibration delay and for sampling an input signal following any of said clock signal edges with a compare delay including a programmable compare delay and an adjustable compare calibration delay, and wherein the interconnect system contacts said IC to provide a first conductive path between each said I/O terminal and its corresponding tester channel for conveying signals therebetween, the method comprising the steps of:
a. providing a measurement circuit for measuring a time interval between an edge of the clock signal and an edge of an output signal of any one of said tester channels,
b. adapting said interconnect system to provide a second conductive path;
c. providing a plurality of first conductors, each corresponding to each of said tester channels; and
d. for each tester channel of said plurality of tester channels:
   d1. causing said interconnect system to contact the tester channel's corresponding first conductor, wherein the corresponding first conductor and the first and second conductive paths from a first signal path between said tester channel and said measurement circuit,
   d2. causing said tester channel to produce output signal edges following said clock signal edges, wherein the first signal path conveys said output signal edges as input signal edges to said measurement circuit, and
   d3. causing said measurement unit to measure intervals between said clock signal edges and its input signal edges arriving by said first signal path.

10. The method in accordance with claim 9 wherein step d further comprises the substeps of:
d4. concurrent with substep d2 and d3, adjusting the calibration delay of the tester channel so that said measurement unit measures intervals of a particular duration.

11. The method in accordance with claim 10 further comprising the steps of:
e. providing a plurality of second conductors; and
f. following step d, causing said interconnect system to contact said second conductors, wherein the interconnect system and said second conductors provide second signal paths between pairs of the tester channels.

12. The method in accordance with claim 11 further comprising the steps of:
  g. for each of said pairs:
    g1. causing one tester channel of said pair to send an output signal having an output signal edge via said signal path to another tester channel of the pair, and
    g2. concurrent with substep g1, adjusting the calibration delay of said another tester channel of the pair so that it samples the output signal close to said output signal edge.

13. The method in accordance with claim 11 wherein said plurality of first conductors and said plurality of second conductors are implemented on said semiconductor wafer.

14. The method in accordance with claim 11 wherein said plurality of first conductors and said plurality of second conductors are implemented on a calibration wafer other than said semiconductor wafer.

15. The method in accordance with claim 9 wherein said plurality of said first conductors are implemented on said semiconductor wafer.

16. The method in accordance with claim 9 wherein said plurality of first conductors are implemented on a calibration wafer other than said semiconductor wafer.

* * * * *